United States Patent [19]

Yamada et al.

[11] Patent Number: 5,731,591
[45] Date of Patent: Mar. 24, 1998

[54] BEAM EXPOSURE SYSTEM HAVING IMPROVED MASK UNIT

[75] Inventors: Yasuhisa Yamada; Hirosi Nozue, both of Tokyo, Japan

[73] Assignee: NEC Corporation, Tokyo, Japan

[21] Appl. No.: 784,513

[22] Filed: Jan. 17, 1997

[30] Foreign Application Priority Data

Jan. 19, 1996 [JP] Japan ................................ 8-007817

[51] Int. Cl.$^6$ ................................................. H01J 37/302
[52] U.S. Cl. ......................... 250/492.2; 250/492.22; 250/398; 430/5
[58] Field of Search ........................... 250/492.2, 492.22, 250/492.23, 398; 378/34, 35; 430/5

[56] References Cited

U.S. PATENT DOCUMENTS 4,855,197  8/1989  Zapka et al. ................ 250/492.2
5,260,579  11/1993  Yasuda et al. ............... 250/492.2
5,334,282  8/1994  Nakayama et al. ............. 156/643

FOREIGN PATENT DOCUMENTS 63-175423  7/1988  Japan .
4-137520  5/1992  Japan .

*Primary Examiner*—Kiet T. Nguyen
*Attorney, Agent, or Firm*—Foley & Lardner

[57] ABSTRACT

In a beam exposure system, a beam is irradiated onto a mask unit, and the beam passed through the mask unit is deflected and is irradiated onto a target. The mask unit includes a polygonal hollowed holder and a plurality of masks. The holder is formed by mask mounting plates each having apertures for mounting the masks, and frames each having an aperture for passing the beam therethough.

11 Claims, 6 Drawing Sheets

BEAM EXPOSURE SYSTEM HAVING IMPROVED MASK UNIT

BACKGROUND OF THE INVENTION

1. Field of the Invention

The present invention relates to a beam exposure system such as electron beam exposure system, and more particularly, to the improvement of a mask thereof.

2. Description of the Related Art

In a prior art electron beam exposure system, in order to enhance the throughput, an electron beam is irradiated onto a mask unit having a pattern, and the electron beam passed through the mask unit is irradiated onto a target.

A first type of the mask unit is formed by a mask, a holder for supporting the mask in an aperture thereof, and a holder plate for mounting the holder. This will be explained later in detail.

In a second type of the mask unit, a plurality of masks are mounted in apertures of a holder coupled to a holder plate. The number of masks can be larger than the first type of mask unit (see: JP-A-63-175423). This also will be explained later in detail.

Also, it known that fine meshes each smaller than a resolution limit value are provided in apertures of a mask to correct proximity effect (see: JP-A-4-137520).

In the above-described prior art electron beam exposure system, however, since the number of patterns provided in the mask unit is small, the number of possible depicted patterns is limited. When depicting all possible patterns, the mask, i.e., the holder needs to be replaced with another holder, thus reducing the operating efficiency of the system. Also, fine metal meshes, each smaller than a resolution limit value may be provided with the apertures of the mask to correct proximity effect. In this case, however, it is difficult to form such meshes due to the mechanical deterioration of the mask. Therefore, another mask having such meshes has to be mounted on the system, thus increasing the manufacturing cost of the system.

SUMMARY OF THE INVENTION

It is an object of the present invention to provide an improved mask apparatus (unit) used in a beam exposure sytem such as an electrom beam exposure system, which can enhance the operating efficiency and decrease the manufacturing cost.

According to the present invention, in a beam exposure sytem, a beam is irradiated onto a mask unit, and the beam passed through the mask unit is deflected and is irradiated onto a target. The mask unit includes a polygonal hollowed holder and a plurality of masks. The holder is fomed by mask mounting plates each having apertures for mounting the masks, and frames each having an aperture for passing the beam therethrough.

Also, fine metal meshes for correcting proximity effect are provided in the aperture of each of the frames.

BRIEF DESCRIPTION OF THE DRAWINGS

The present invention will be more clearly understood form the description as set forth below, as compared with the prior art, with reference to the accompanying drawings, wherein.

DESCRIPTION OF THE PREFERRED EMBODIMENT

Before the description of the preferred embodiment, prior art electron beam exposure systems will be explained with reference to FIGS. 1, 2 and 3.

Figure 1:
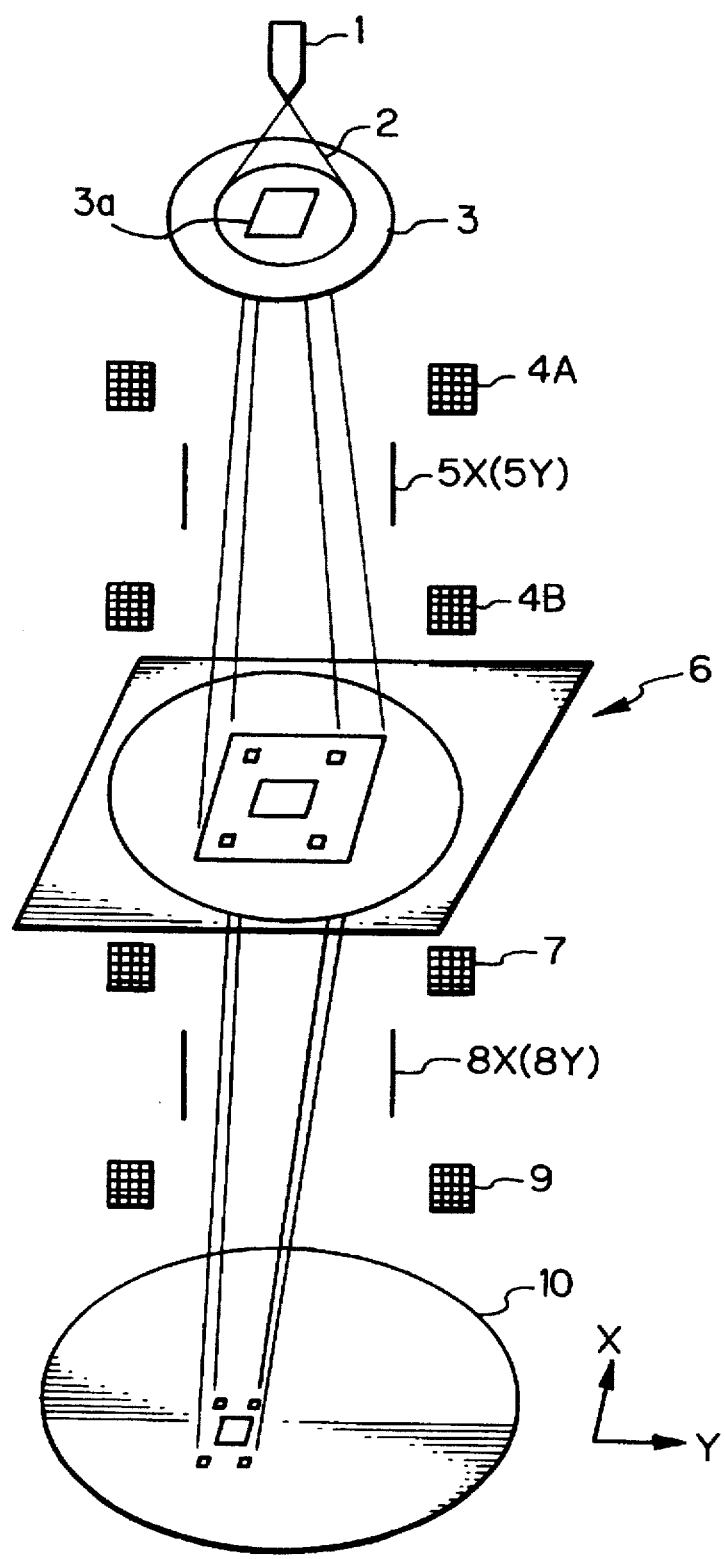
FIG. 1 is a schematic view illustrating a prior art electron beam exposure system.

In FIG. 1, which illustrates a first electron beam exposure system, reference numeral 1 designates an electron gun for emitting an electron beam 2. The electron beam 2 passes through a rectangular aperture 3a of a mask unit 3, and further passes through a lens 4A, deflection units 5X and 5Y composed of electrostatic plates, and a lens 4B, to reach a mask unit 6.

Figure 2:
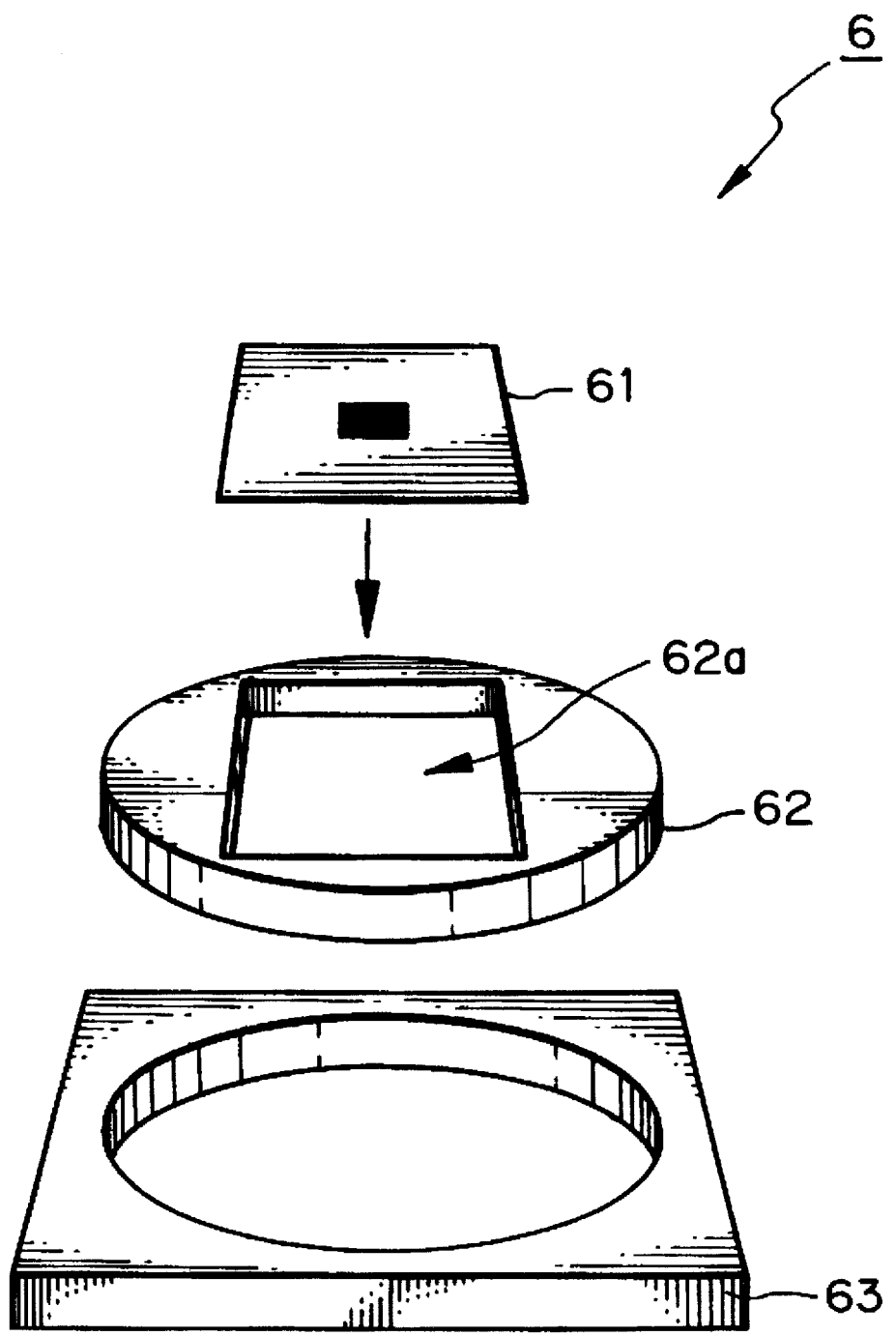
FIG. 2 is a perspective view of the mask unit of FIG. 1.

As illustrated in FIG. 2, the mask unit 6 is formed by a mask 61, a holder 62 for supporting the mask 61 in an aperture 62a thereof, and a holder plate 63 for mounting the holder 62.

Returning to FIG. 1, the electron beam 2 passes through the mask unit 6, a demagnifying lens 7, deflection units 8X and 8Y composed of electrostatic plates, and a demagnifying lens 9 which is called a projecting lens, and is irradiated onto a target 10.

The deflection units 8X and 8Y are controlled, thereby to repeat a shot (deflection operation). Thus, possible patterns are depicted on the target 10.

In the prior art electron beam exposure system of FIGS. 1 and 2, since only one pattern is provided in the mask unit 6, the number of possible depicted patterns is limited. When depicting all possible patterns, the mask 61, i.e., the holder 62 needs to be replaced with another holder, thus reducing the operating efficiency of the system. Also, fine metal meshes, each smaller than a resolution limit Value, may be provided with the apertures of the mask 61 to correct proximity effect. In this case, however, it is difficult to form such meshes due to the machanical deterioration of the mask 61. Therefore, another mask having such meshes has to be mounted on the system, thus increasing the manufacturing cost of the system.

Figure 3:
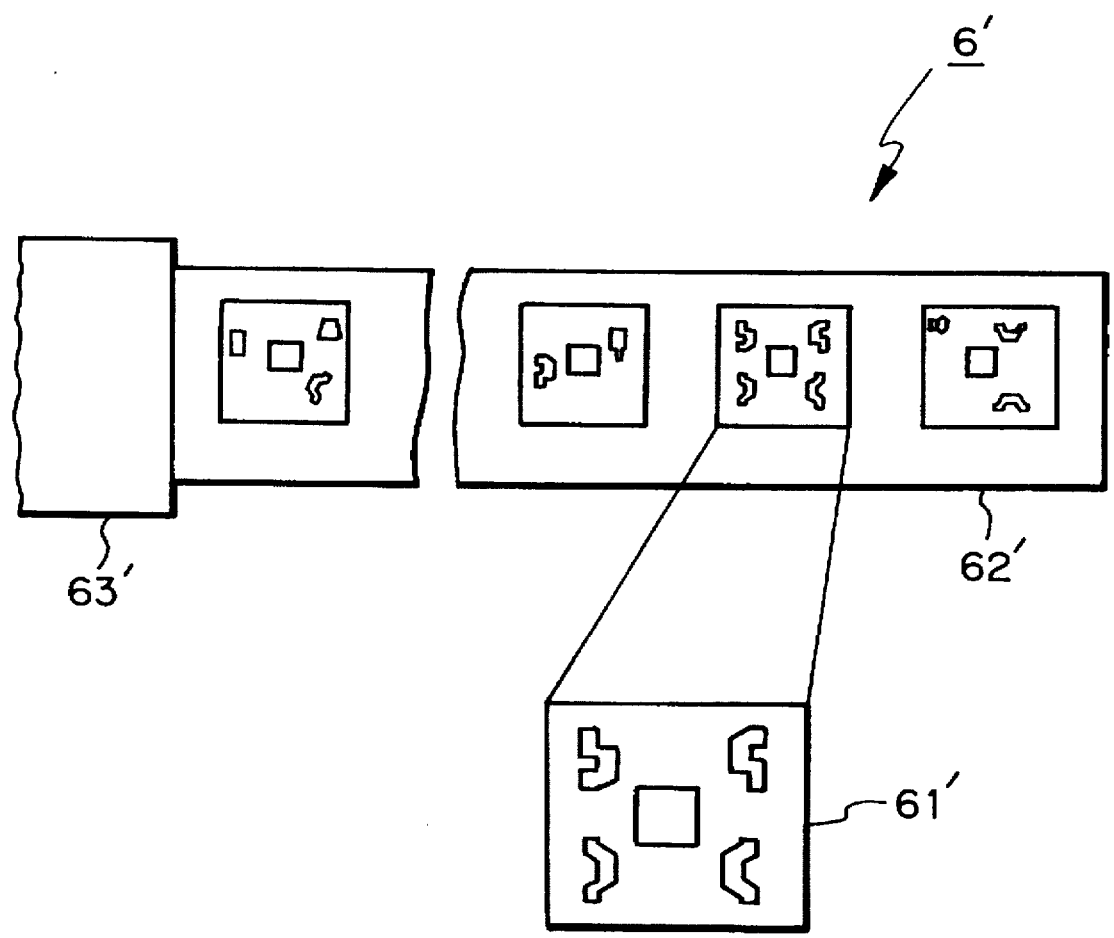
FIG. 3 is a plan view of another type of the mask unit of FIG. 1.

In FIG. 3, which illustrates another prior art mask unit 6', a plurality of masks 61' are mounted in apertures of a holder 62' coupled to a holder plate 63'. The number of masks can be larger than in the system of FIGS. 1 and 2.

Even in the mask 6' of FIG. 3, since the number of patterns provided in the mask unit 6 is limited, the number of possible depicted patterns is also limited. Therefore, when depicting all possible patterns, the masks 61', i.e., the holder 62' needs to be replaced with another holder, thus reducing the operating efficiency of the system. Also, it is difficult to form meshes for correcting proximity effect due to the machanical deterioration of the masks 61'. Therefore, another mask having such meshes has to be mounted on the system, thus increasing the manufacturing cost of the system.

Figure 4:
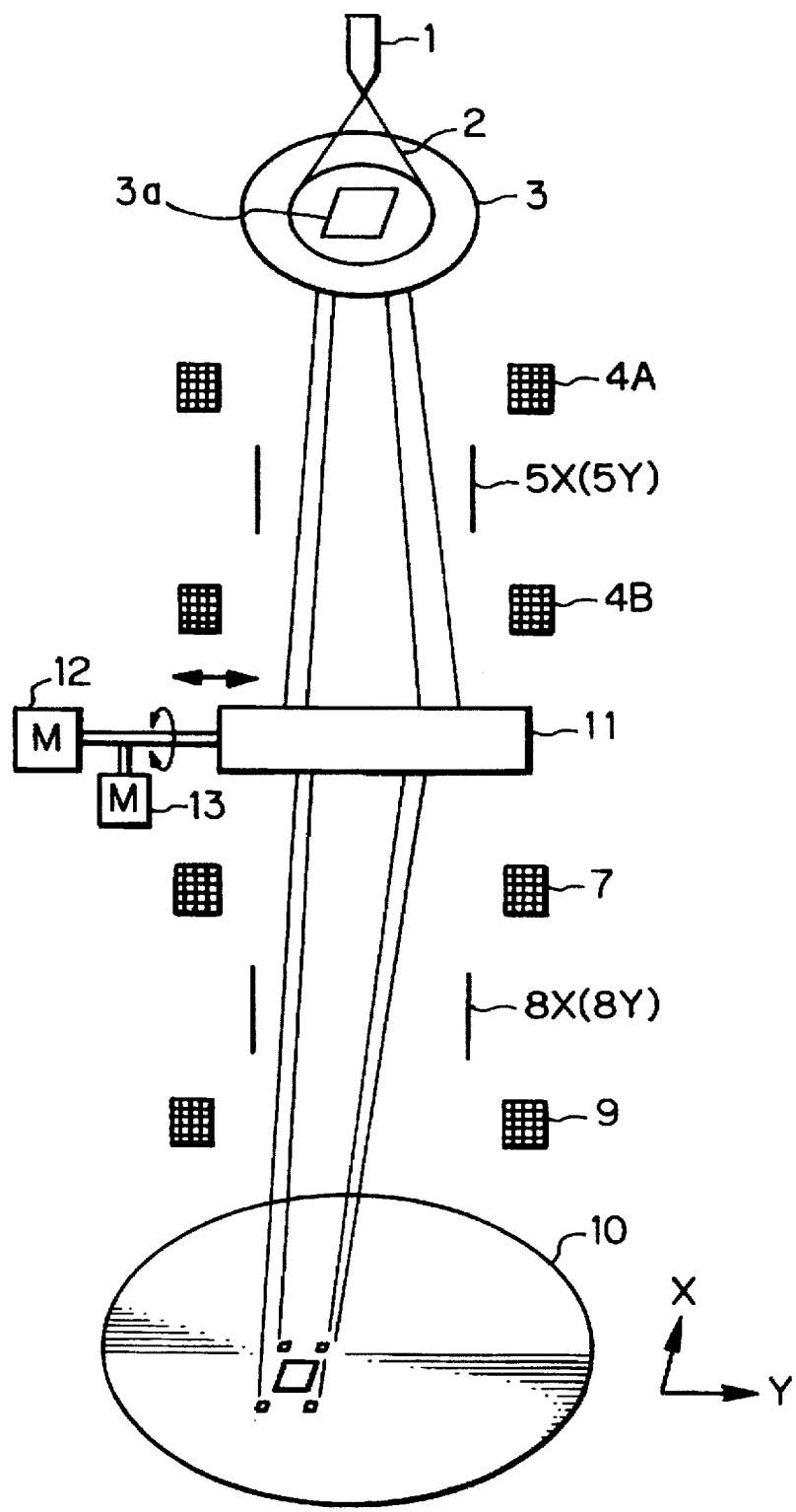
FIG. 4 is a schematic view illustrating an embodiment of the electron beam exposure system according to the present invention.

In FIG. 4, which illustrates an embodiment of the present invention, a mask unit 11, a driving unit 12 for moving the mask unit 11 along a horizontal direction and a driving unit 13 for rotating the mask unit 11 are provided instead of the mask unit 6 of FIG. 1.

Figure 5:
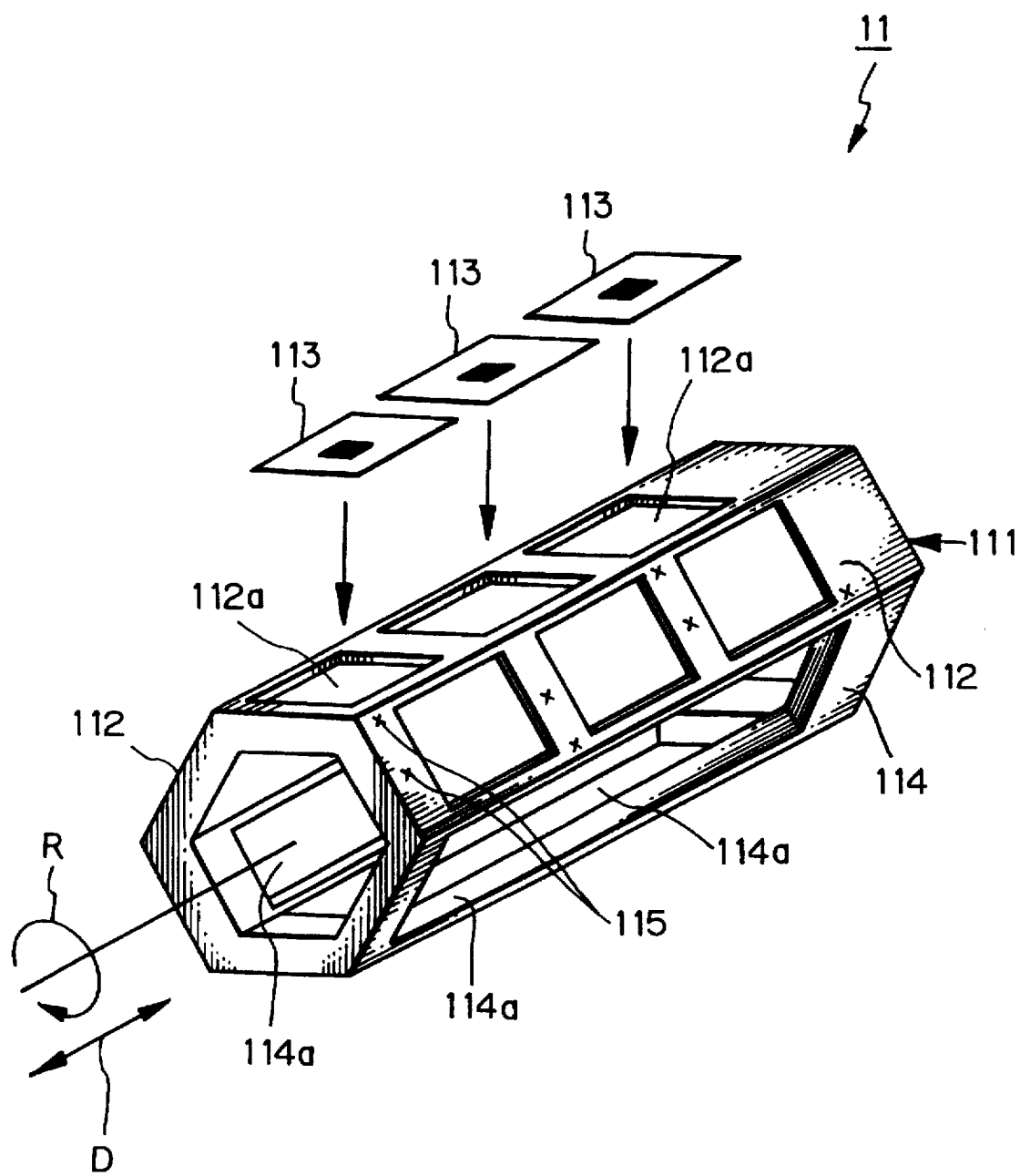
FIG. 5 is a perspective view of the mask unit of FIG. 4.

The mask unit 11 of FIG. 4 is illustrated in detail in FIG. 5.

The mask unit 11 includes a polygonal hollowed holder 111 which is, in this case, hexagonal. The holder 111 is formed by a plurality of mask mounting plates 112 each having a plurality of apertures 112a for supporting masks 113. Also, the holder 111 is formed by a plurality of frames 114 each having an aperture 114a for passing an electron beam therethrough. Further, one of the mask mounting plates 112 opposes one of the frames 114.

In FIG. 5, reference numeral 115 designate alignment marks for the masks 113.

The mask unit 11 can be moved along a direction D by the driving unit 12 of FIG. 4. Also, the mask unit 11 can be rotated as indicated by R by the driving unit 13 of FIG. 4.

The operation of the system of FIGS. 4 and 5 is as follows.

First, the masks 113, which are the same type or a different type, are mounted on the apertures 112a of the mask mounting plates 112 in advance.

Next, the mask unit 11 is set in the system of FIG. 4, and the alignment of the mask unit 11 is carried out by the driving units 12 and 13 with reference to the alignment marks 115.

Finally, an electron beam is emitted from the electron gun 1 via the mask unit 3 to reach the mask unit 11. Then, the electron beam passes further through one of the masks 113 and one of the apertures 114a to reach the target 10.

Figure 6:
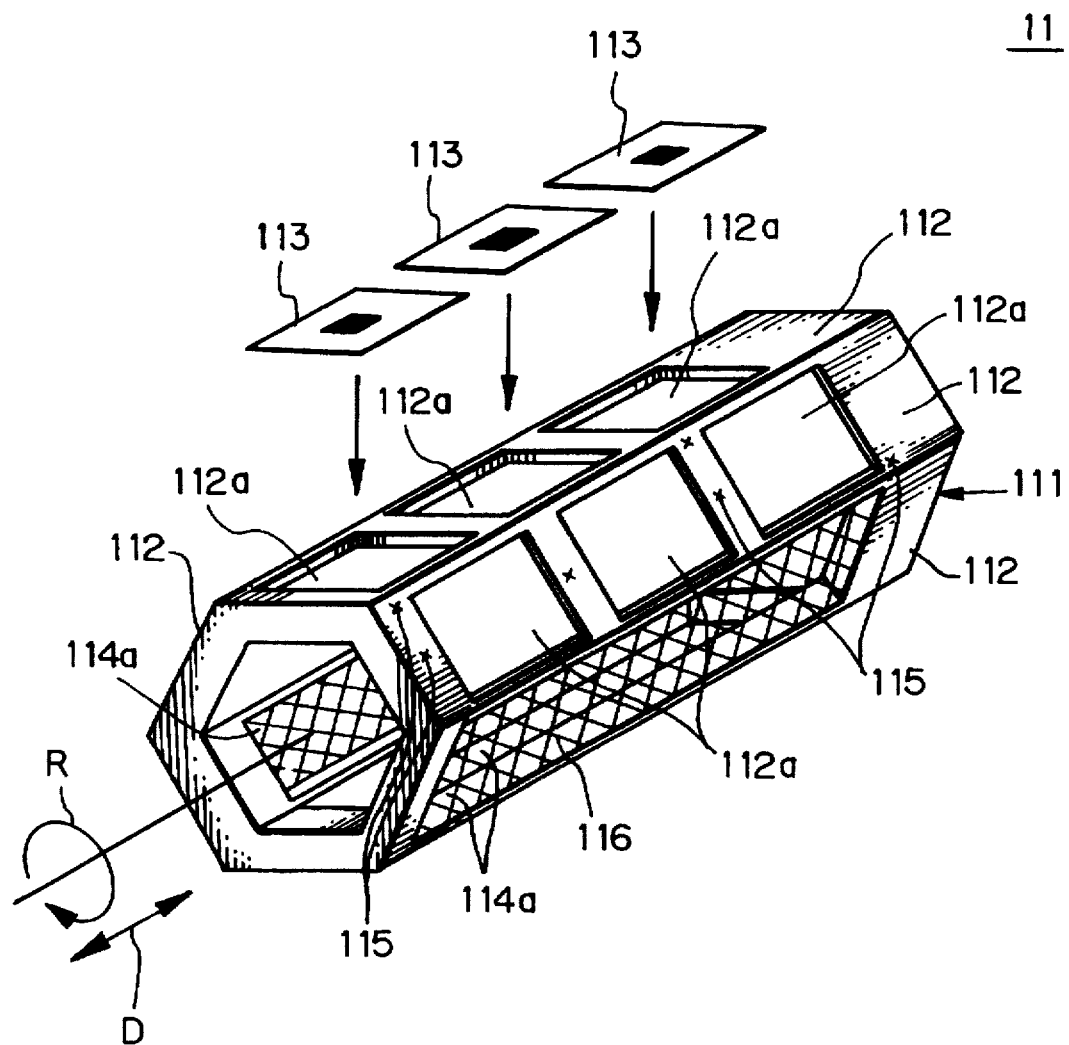
FIG. 6 is a perspective view of a modification of the mask unit of FIG. 5.

In FIG. 6, which illustrates a modification of the mask unit 11 of FIG. 5, fine metal meshes 116 each smaller than a resolution limit value are provided in the apertures 114a of the frames 114, thus correcting proximity effect.

Thus, in the electron beam exposure system of FIG. 4 using the mask unit 11 of FIG. 6, it is possible to correct proximity effects among the patterns due to the difference in energy deposited within a resist. That is, generally, the energy of the electron beam is deposited within the resist due to the front scattering and the back scattering of electrons. That is, the meshes 116 are adjusted to equalize the energy deposited in the resist of the target 10.

In the electron beam exposure system of FIGS. 4, 5 and 6, although only one mask unit 11 is provided, a plurality of such mask units 11 can be provided in a revolver shape.

Also, the present invention can be applied to other electric charge beam exposure systems, a light beam exposure sytem, or an X-ray beam exposure system.

As explained hereinabove, according to the present invention, since a large number of patterns can be provided in the mask unit, the number of replacing operations of masks can be reduced, thus enhancing the operating efficiency of the system. Also, since the fine meshes for correcting proximity effect are provided in the mask unit, the special masks for such fine meshes are unnecessary, thus decreasing the manufacturing cost of the system.

We claim:

1. A mask apparatus for use in a beam exposure system, said apparatus comprising:

a polygonal hollowed holder including a plurality of mask mounting plates and a plurality of frames, a plurality of first apertures being formed in each of said mask mounting plates, and a second aperture being formed in each of said frames; and a plurality of masks mounted in said first apertures.

2. The mask apparatus as set forth in claim 1, wherein one of said mask mounting plates opposes one of said frames.

3. The apparatus as set forth in claim 1, further comprising fine metal meshes, each mounted in said second aperture of one of said frames, for correcting proximity effect.

4. The mask apparatus as set forth in claim 1, further comprising:

first driving means for moving said holder along an axis of said holder; and second driving means for rotating said holder.

5. The mask apparatus as set forth in claim 1, further comprising alignment marks marked on said holder.

6. A beam exposure system comprising:

beam emitting means for emitting a beam;

mask means;

first deflection means, arranged between said beam emitting means and said mask means, for irradiating said beam onto said mask means; and second deflection means for deflecting said beam passed through said mask means to irradiate said beam onto a target, said mask means comprising:

a polygonal hollowed holder including a plurality of mask mounting plates and a plurality of frames, a plurality of first apertures being formed in each of said mask mounting plates, and a second aperture being formed in each of said frames; and a plurality of masks mounted in said first apertures.

7. The system as set forth in claim 6, wherein one of said mask mounting plates opposes one of said frames.

8. The system as set forth in claim 6, further comprising fine metal meshes, each mounted in said second aperture of one of said frames, for correcting proximity effect.

9. The system as set forth in claim 6, further comprising:

first driving means for moving said holder along an axis of said holder; and second driving means for rotating said holder.

10. The system as set forth in claim 6, further comprising alignment marks are marked on said holder.

11. The system as set forth in claim 6, wherein said beam is one of an electric charge beam, a light beam and an X-ray beam.

* * * * *